(12) United States Patent
Wu et al.

(10) Patent No.: US 10,868,241 B2
(45) Date of Patent: Dec. 15, 2020

(54) APPARATUS FOR POLARIZING A SEMICONDUCTOR WAFER AND METHOD FOR FABRICATING A MAGNETIC SEMICONDUCTOR DEVICE

(71) Applicant: TAIWAN SEMICONDUCTOR MANUFACTURING COMPANY LTD., Hsinchu (TW)

(72) Inventors: Jim-Wei Wu, Chiayi County (TW); Li Tseng, Taipei (TW); Chia-Hsun Chang, Changhua County (TW); Wen-Chih Wang, New Taipei (TW); Keith Kuang-Kuo Koai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/414,551

(22) Filed: May 16, 2019

(65) Prior Publication Data
US 2020/0365797 A1 Nov. 19, 2020

(51) Int. Cl.
| | |
|---|---|
| *H01L 43/12* | (2006.01) |
| *H01L 43/02* | (2006.01) |
| *H01L 27/22* | (2006.01) |
| *H01L 21/68* | (2006.01) |

(52) U.S. Cl.
CPC ............ *H01L 43/12* (2013.01); *H01L 27/222* (2013.01); *H01L 43/02* (2013.01); *H01L 21/68* (2013.01)

(58) Field of Classification Search
None
See application file for complete search history.

(56) References Cited

U.S. PATENT DOCUMENTS

| | | | |
|---|---|---|---|
| 6,163,477 A | 12/2000 | Tran | |
| 2006/0226940 A1* | 10/2006 | Lee | ............................ H01F 6/00 335/216 |
| 2009/0001351 A1* | 1/2009 | Shibasaki | ............... H01L 43/12 257/14 |
| 2013/0300040 A1* | 11/2013 | Moffatt | ................ C21D 9/0006 266/249 |
| 2019/0049514 A1* | 2/2019 | O'Brien | ............... G01R 33/098 |

* cited by examiner

*Primary Examiner* — Steven B Gauthier
(74) *Attorney, Agent, or Firm* — WPAT, P.C., Intellectual Property Attorneys; Anthony King

(57) ABSTRACT

The present disclosure provides a method for fabricating a magnetic semiconductor device, including receiving a semiconductor wafer, disposing the semiconductor wafer under a first electromagnetic element, wherein the first electromagnetic element comprises a primary dimension and a secondary dimension from a top view perspective, the primary dimension being greater than the secondary dimension, and displacing the semiconductor wafer along a predetermined path along the secondary dimension of the first electromagnetic element.

20 Claims, 20 Drawing Sheets

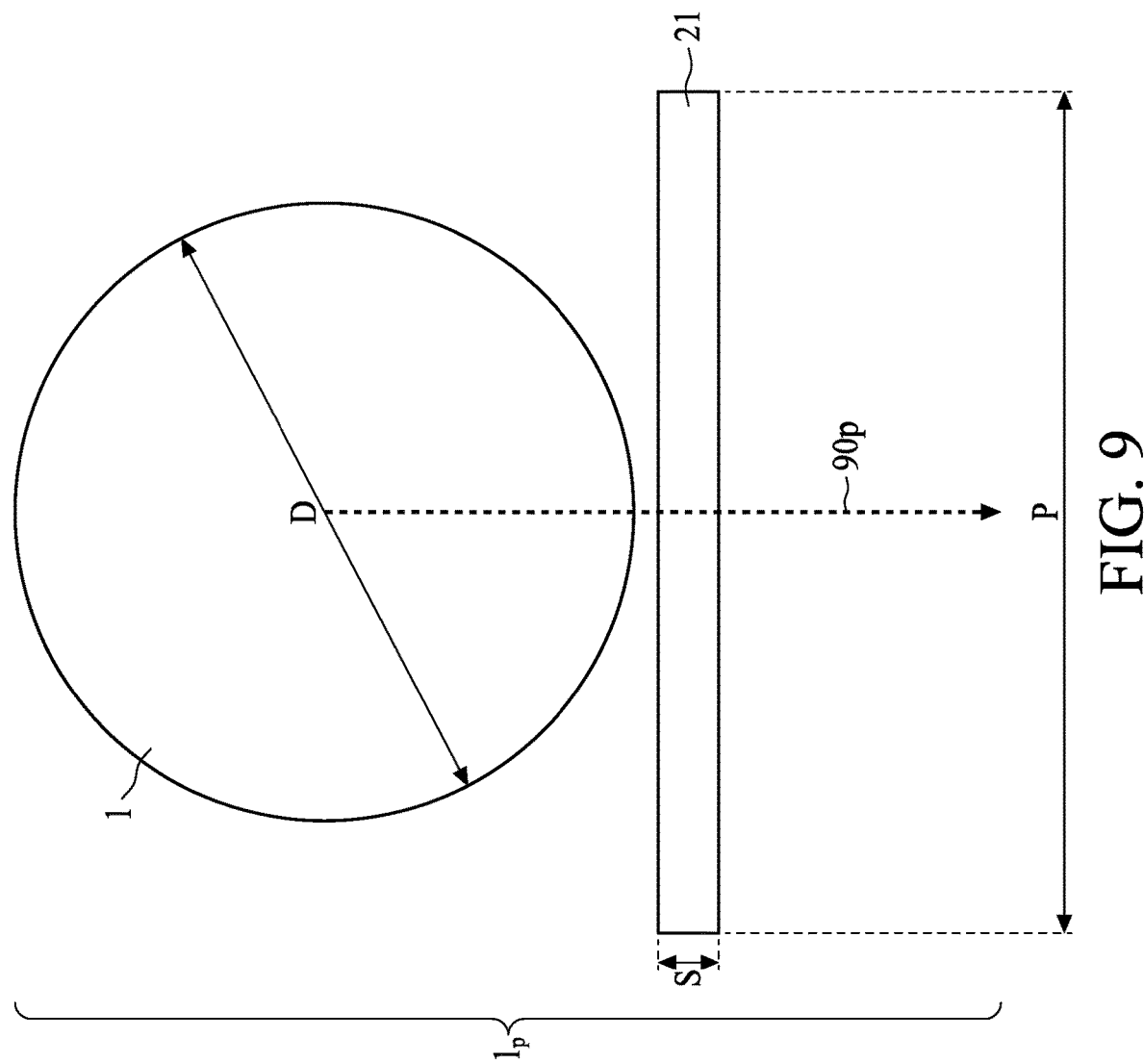

APPARATUS FOR POLARIZING A SEMICONDUCTOR WAFER AND METHOD FOR FABRICATING A MAGNETIC SEMICONDUCTOR DEVICE

BACKGROUND

Magnetic devices are widely used semiconductor devices for electronic applications, including radios, televisions, cell phones, and personal computing devices. One type of well-known magnetic devices is the semiconductor storage device, such as magnetic random access memories (MRAMs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a schematic drawing illustrating a top perspective view of an electromagnet element and a predetermined path of a predetermined path of a semiconductor wafer during an operation of polarizing a semiconductor wafer, in accordance with some embodiments of the present disclosure.

DETAILED DESCRIPTION

Figure 1A:
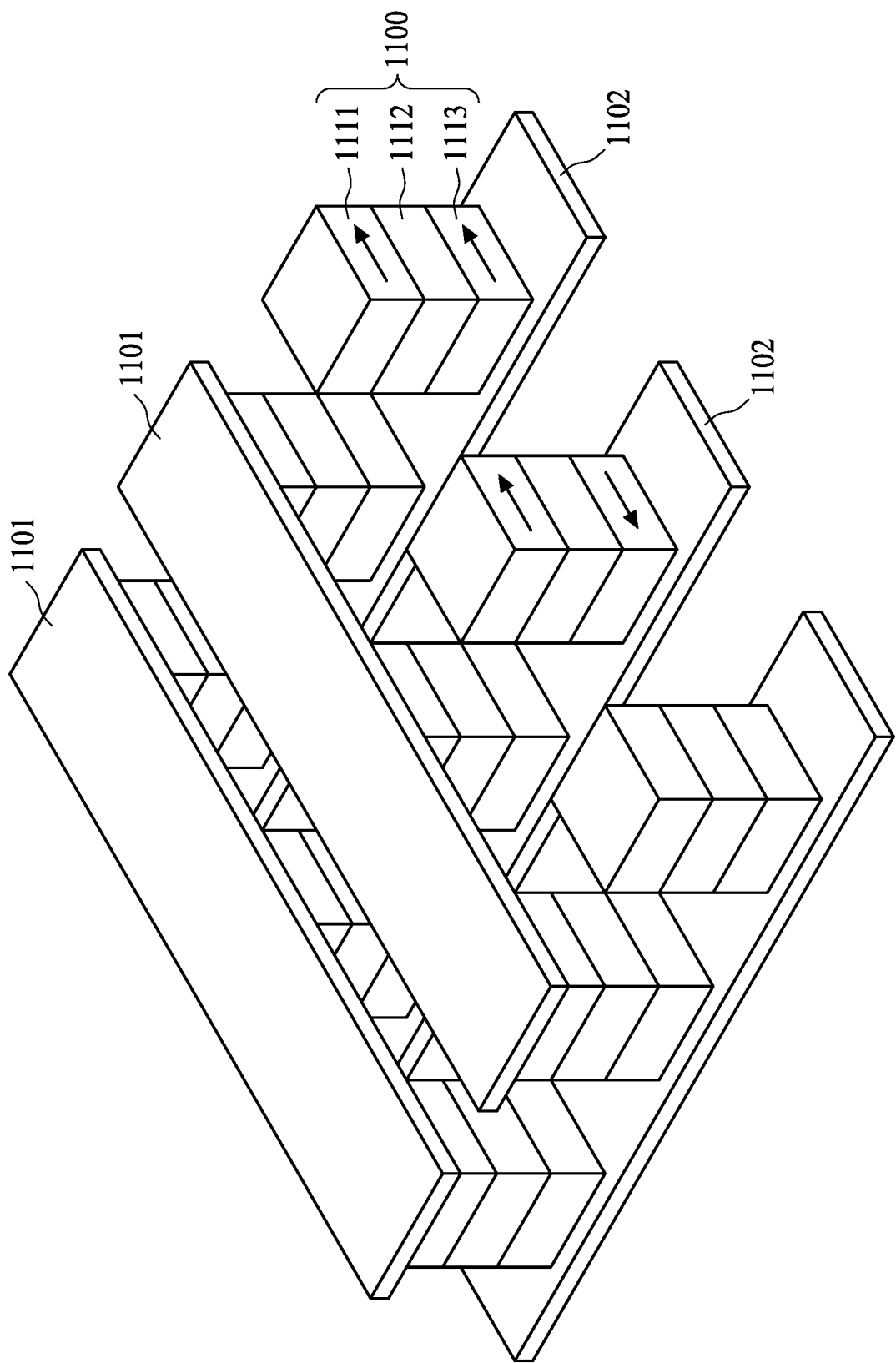
FIG. 1A is an illustration of a magnetic semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1B:
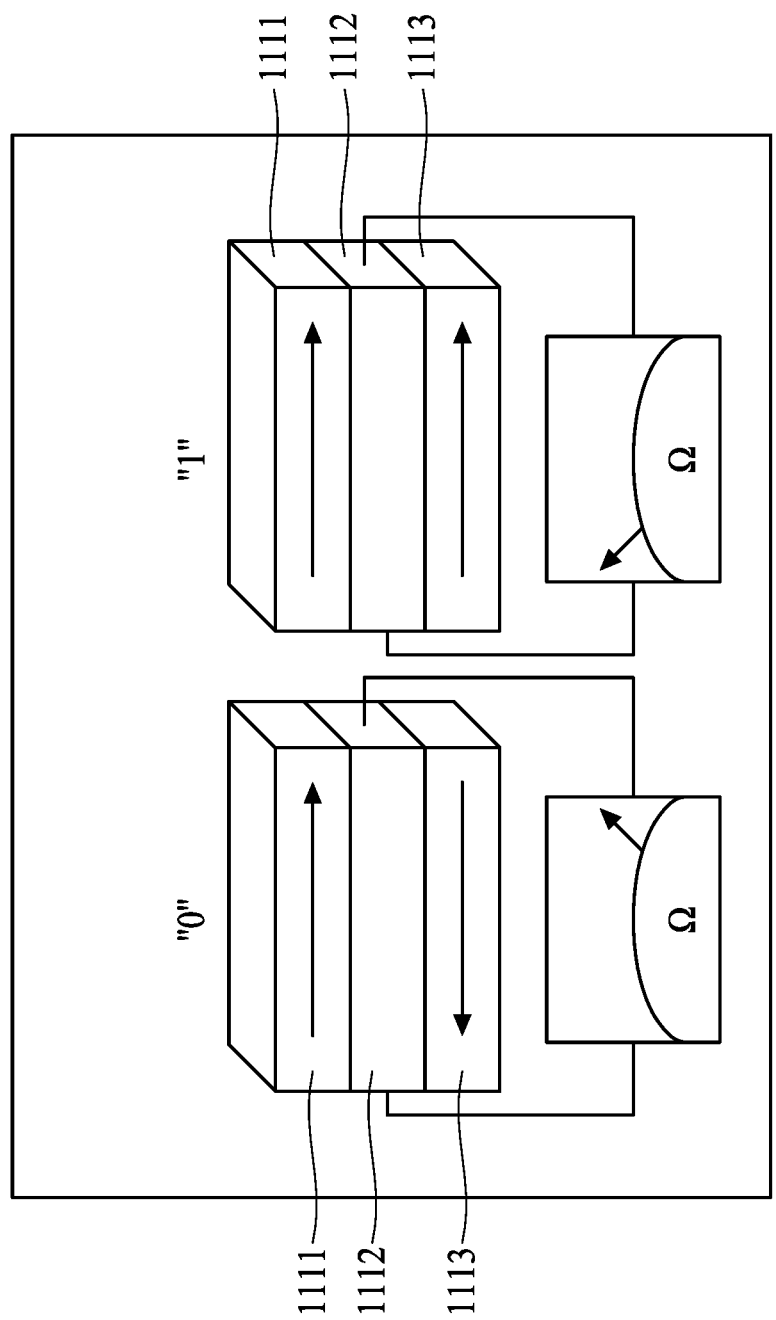
FIG. 1B shows a comparison of resistivity between parallel state and anti-parallel state of a magnetic semiconductor device.

Referring to FIG. 1A and FIG. 1B, FIG. 1A is an illustration of a magnetic semiconductor device, FIG. 1B shows a comparison of resistivity between parallel state and anti-parallel state of a magnetic semiconductor device. Some of the recent development pertinent to magnetic devices such as MRAMs involves spin electronics, which combines semiconductor technology and magnetic materials and devices. The spin polarization of electrons, rather than the charge of the electrons, is used to indicate the state of "1" or "0". One such spin electronic device is a spin torque transfer (STT) magnetic tunneling junction (MTJ) device 1100.

An MRAM device 1100 may include an array of memory cells. In some embodiments, word lines 1102 extend along rows of the memory cells, and bit lines 1101 extend along columns of the memory cells. Each memory cell is located at a cross point of a word line 1102 and a bit line 1101. A memory cell stores a bit of information as an orientation of a magnetization. The magnetization orientation of each memory cell indicates one of two stable orientations at any given time. These two stable orientations, parallel and anti-parallel, represent logic values of "1" and "0", as shown in FIG. 1B and will be subsequently discussed. The magnetization orientation of a selected memory cell may be changed by supplying currents to a word line 1102 and a bit line 1101 crossing the selected memory cell. The currents create two orthogonal magnetic fields that, when combined, switch the magnetization orientation of a selected memory cell from parallel to anti-parallel or vice versa.

For example, MTJ device 1100 includes a pinned layer 1111, a tunnel layer 1112, and a free layer 1113. Pinned layer 1111 has a fixed magnetization direction. The magnetization direction of free layer 1113 can be reversed by applying a current through tunnel layer 1112, which causes the injected polarized electrons within free layer 1113 to exert so-called spin torques on the magnetization of free layer 1113.

When current flows in the direction from free layer 1113 to pinned layer 1111, electrons flow in a reverse direction, that is, from pinned layer 1111 to free layer 1113. Thus electrons are polarized to the same magnetization direction of pinned layer 1111 after passing pinned layer 1111, flowing through tunnel layer 1112 and then into and accumulating in free layer 1113. Eventually, the magnetization of free layer 1113 is parallel to that of pinned layer 1111, and MTJ device 1100 will be at a low resistance state (state of "1" as shown in FIG. 1B). The electron injection caused by current is referred to as a major injection.

When current flowing from pinned layer 1111 to free layer 1113 is applied, electrons flow in the direction from free layer 1113 to pinned layer 1111. The electrons having the same polarization as the magnetization direction of pinned layer 1111 are able to flow through tunnel layer 1112 and into pinned layer 1111. Conversely, electrons with polarization differing from the magnetization of pinned layer 1111 will be reflected (blocked) by pinned layer 1111 and will accumulate in free layer 1113. Eventually, magnetization of free layer 1113 becomes anti-parallel to that of pinned layer 1111, and MTJ device 1100 will be at a high resistance state (state of "0" as shown in FIG. 1B). The respective electron injection caused by current is referred to as a minor injection.

Switching the magnetization orientation of a magnetic semiconductor device from parallel to anti-parallel or vice versa may be achieved by applying a magnetic field on the magnetic semiconductor device. Specifically, the magnetic field may be applied over a semiconductor wafer fabricated with a plurality of magnetic semiconductor devices. However, current efficiency of switching the magnetization orientation of magnetic semiconductor devices on a semiconductor wafer is undesirable. A new polarization technique is thus required to enhance the throughput of magnetic semiconductor devices production and taking other practical factors into consideration, for example, production power density and cost.

Figure 2A:
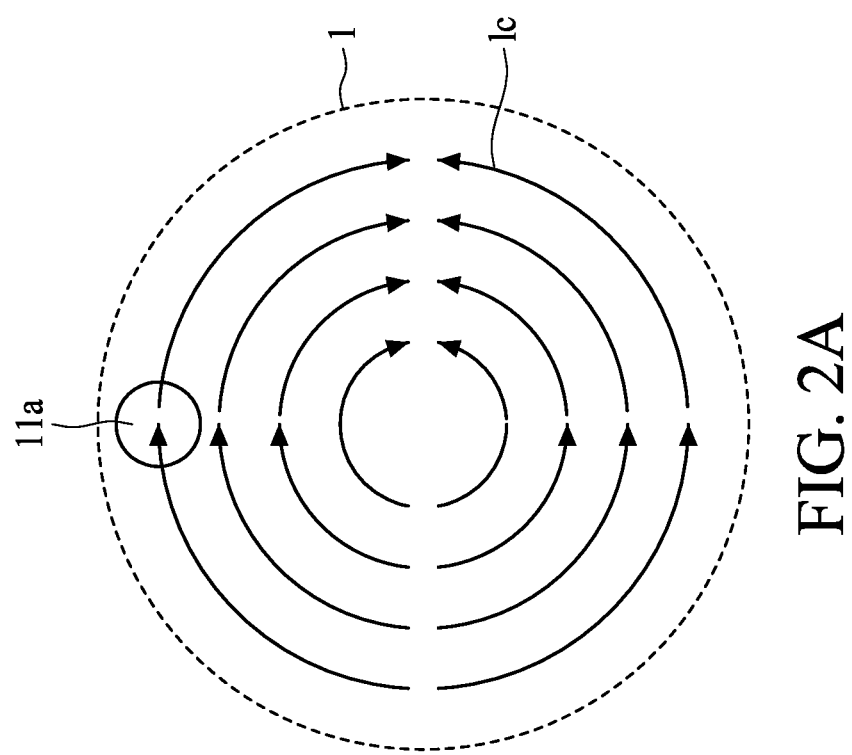
FIG. 2A is a schematic drawing illustrating an apparatus for polarizing a semiconductor wafer, in accordance with some comparative embodiments of the present disclosure.

Referring to FIG. 2A, FIG. 2A is a schematic drawing illustrating an apparatus for polarizing a semiconductor wafer, in accordance with some comparative embodiments of the present disclosure. An electromagnetic element 11*a* may be relatively moved along a path 1*c* along a circumference of a semi-circular path above/under a semiconductor wafer 1. However, the interval of polarizing a semiconductor wafer 1 may be undesirably long due to the small scanning area and long scanning path, and the efficiency of polarizing a semiconductor wafer 1 may thus be undesirably lowered.

Figure 2B:
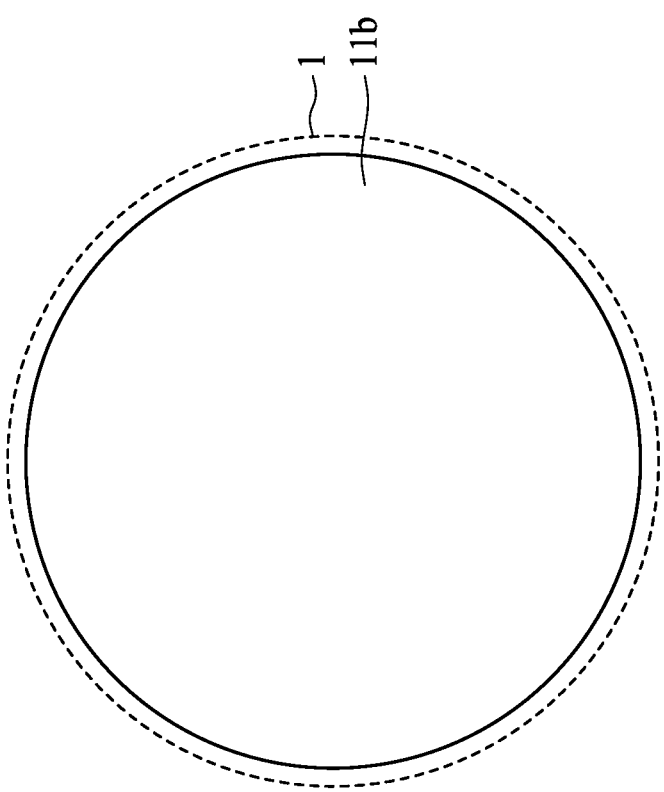
FIG. 2B is a schematic drawing illustrating an apparatus for polarizing a semiconductor wafer, in accordance with some comparative embodiments of the present disclosure.

Referring to FIG. 2B, FIG. 2B is a schematic drawing illustrating an apparatus for polarizing a semiconductor wafer, in accordance with some comparative embodiments of the present disclosure. An electromagnetic element 11*b* may be placed above/under a semiconductor wafer 1 to polarize a semiconductor wafer 1, wherein a size of the magnetic field emitting plate 11*b* is greater than or close to a size of the semiconductor wafer 1. Although the efficiency of polarizing a semiconductor wafer 1 may be greater, creating an adequate magnitude of magnetic field for polarizing a semiconductor wafer 1 may require undesirably high power supply, which may induce undesirable higher cost. The cross-sectional area of the electromagnetic element 11*b* is positively related to the required power supply within a given period of time.

The present disclosure provides an apparatus for polarizing a semiconductor wafer and methods for polarizing the semiconductor wafer with enhanced production throughput and within a reasonable cost, wherein the length of path of relative scanning movement and the cost for providing adequate power supply are reduced by improving the configuration of the apparatus for polarizing the semiconductor wafer and improving the method for polarizing semiconductor wafer.

Figure 3:
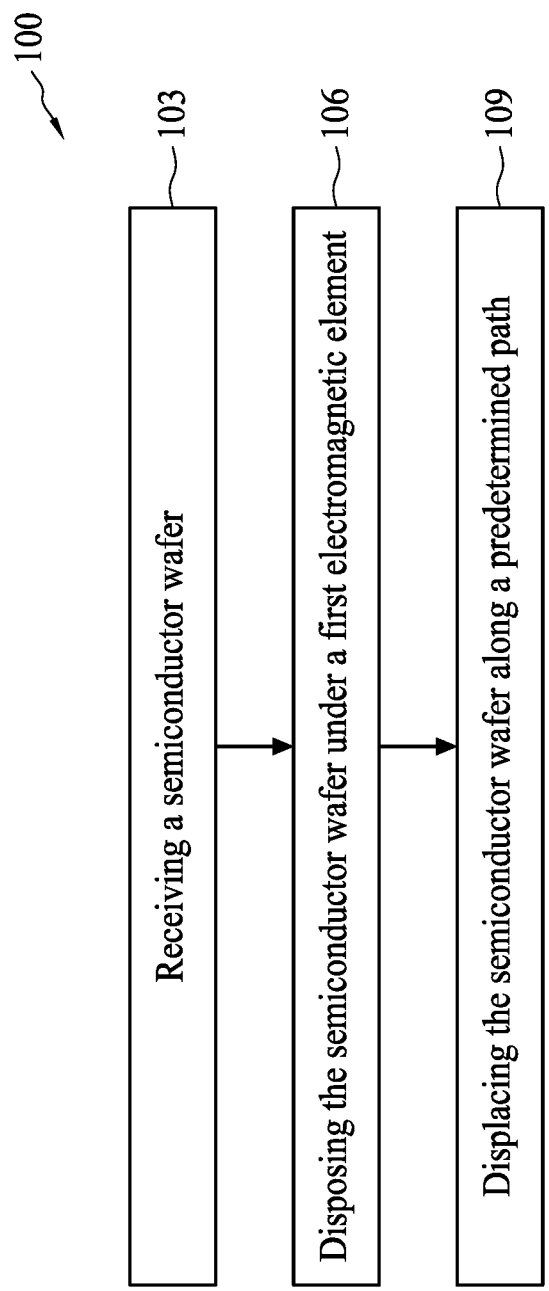
FIG. 3 shows a flow chart representing method for fabricating a magnetic semiconductor device, in accordance with some embodiments of the present disclosure.

Referring to FIG. 3, FIG. 3 shows a flow chart representing method for fabricating a magnetic semiconductor device, in accordance with some embodiments of the present disclosure. The method 100 for fabricating a magnetic semiconductor device includes receiving a semiconductor wafer (operation 103), disposing the semiconductor wafer under a first electromagnetic element (operation 106), and displacing the semiconductor wafer along a predetermined path (operation 109). Detailed description of the method 100 is further addressed in FIG. 7, FIG. 10, FIG. 10A, FIG. 11, and FIG. 11A.

Figure 4:
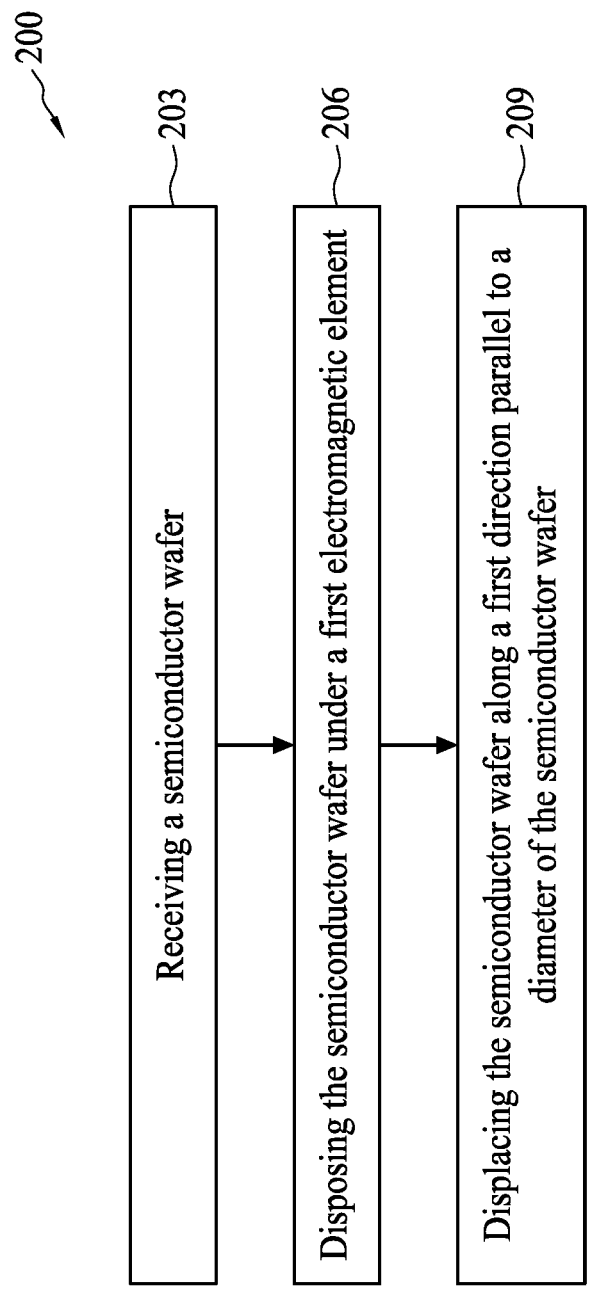
FIG. 4 shows a flow chart representing method for fabricating a magnetic semiconductor device, in accordance with some embodiments of the present disclosure.

Referring to FIG. 4, FIG. 4 shows a flow chart representing method for fabricating a magnetic semiconductor device, in accordance with some embodiments of the present disclosure. The method 200 for fabricating a magnetic semiconductor device includes receiving a semiconductor wafer (operation 203), disposing the semiconductor wafer under a first electromagnetic element (operation 206), and displacing the semiconductor wafer along a first direction parallel to a diameter of the semiconductor wafer (operation 209). Detailed description of the method 200 is further addressed in FIG. 7, FIG. 10, FIG. 10A, FIG. 11, and FIG. 11A.

Figure 5:
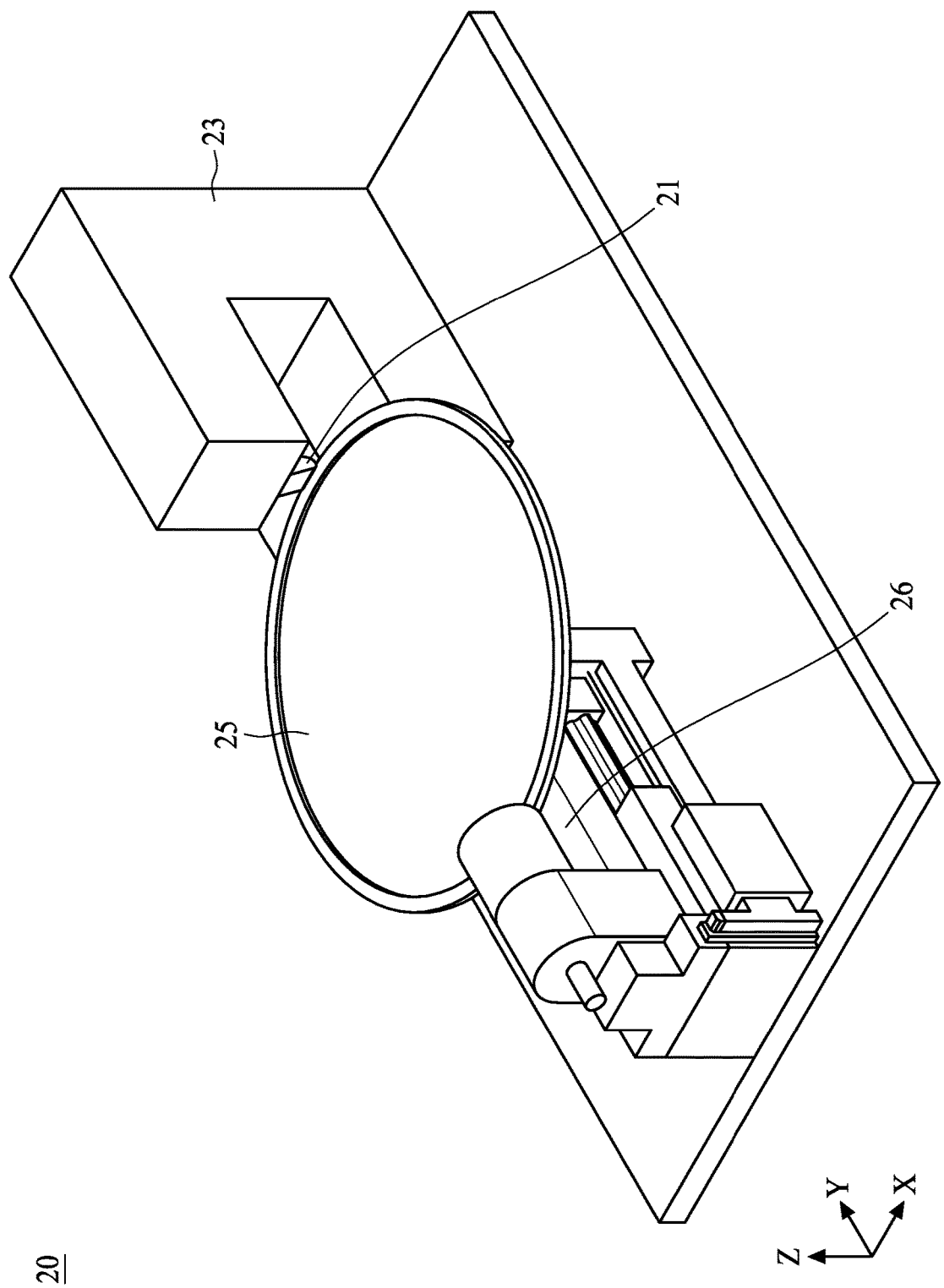
FIG. 5 is a schematic drawing illustrating an apparatus for fabricating a magnetic semiconductor device, in accordance with some embodiments of the present disclosure.
Figure 6:
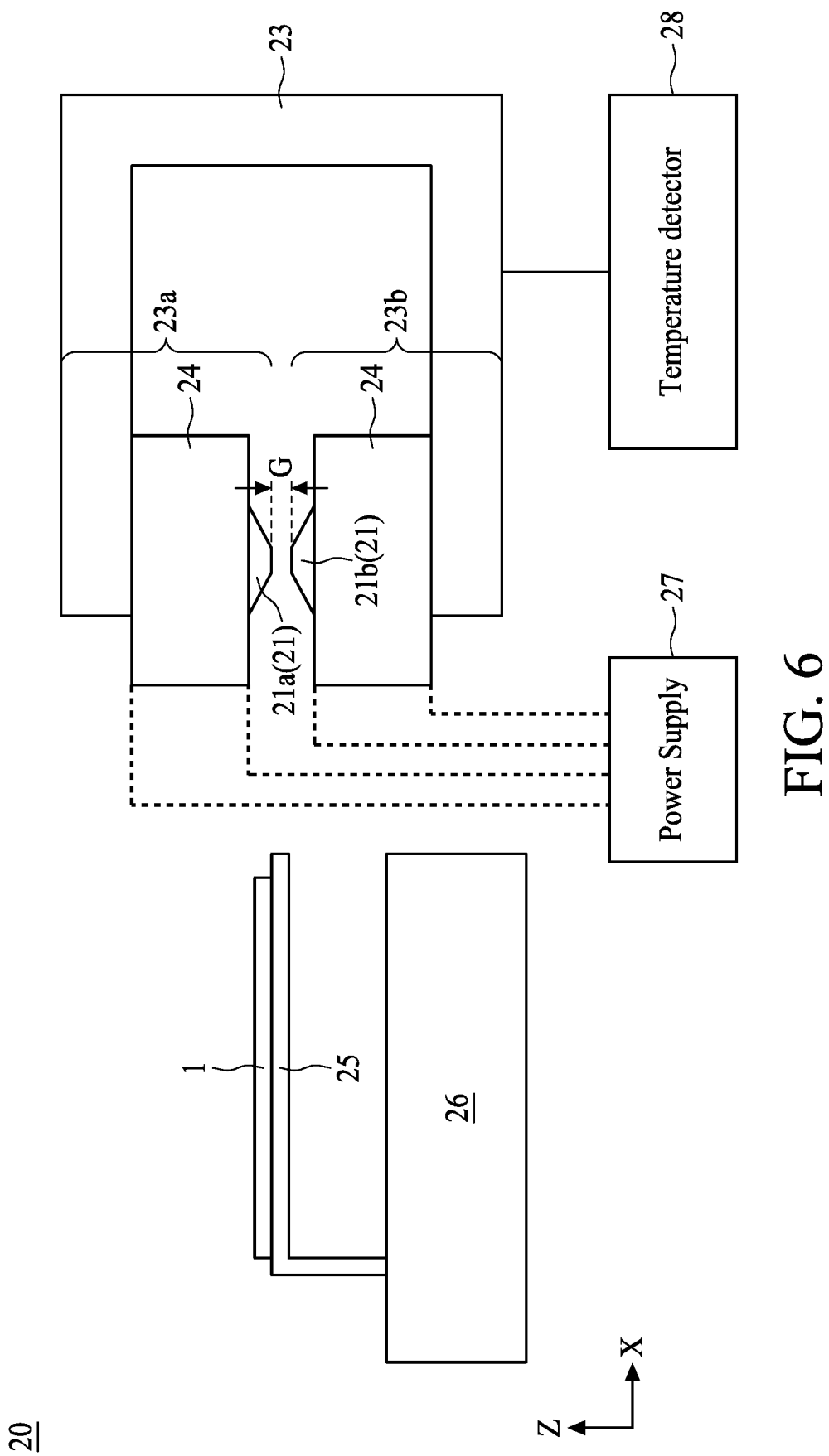
FIG. 6 is a schematic drawing illustrating a cross sectional view of an apparatus for fabricating a magnetic semiconductor device, in accordance with some embodiments of the present disclosure.

Referring to FIG. 5 and FIG. 6, FIG. 5 is a schematic drawing illustrating an apparatus for fabricating a magnetic semiconductor device, FIG. 6 is a schematic drawing illustrating a cross sectional view of an apparatus for fabricating a magnetic semiconductor device, in accordance with some embodiments of the present disclosure. The apparatus 20 for fabricating a magnetic semiconductor device at least include a supporter 25 and an electromagnetic element 21. The apparatus 20 may further include an iron core 23, a movable stage 26, a power supply 27, a coil 24, and/or a temperature detector 28. In some of the embodiments, the electromagnetic element 21 may include a first electromagnetic element 21a and a second electromagnetic element 21b.

The electromagnetic element 21 is electrically connected to the iron core 23. The electromagnetic element 21 may or may not have the same material with the iron core 23. In some embodiments, the iron core 23 has a C-shape, and the first electromagnetic element 21a is connected to an end 23a of the iron core 23, the second electromagnetic element 21b is connected to an opposite end 23b of the iron core 23. In some embodiments, the first electromagnetic element 21a is aligned with the second electromagnetic element 21b, that is, the first electromagnetic element 21a and the second electromagnetic element 21b may have the same shape from top view perspective or at respective cross-sectional view. A gap G is a non-magnetic slit configured on the iron core 23 to separate two ends of the iron core 23 (or in some embodiments, separate the first electromagnetic element 21a and the second electromagnetic element 21b). Such configuration allows magnetic flux to flow through the gap G and its adjacent area from one end to another end. The semiconductor wafer 1 can be transferred between the he first electromagnetic element 21a and the second electromagnetic element 21b. After interposing the semiconductor wafer 1 in the gap G, the first electromagnetic element 21a is above the semiconductor wafer 1, while the second electromagnetic element 21b is under the semiconductor wafer 1. A distance between the first electromagnetic element 21a and the second electromagnetic element 21b may be wider than a thickness of the semiconductor wafer 1 and the supporter 25, but less than a thickness that causes the substantial loss of magnitude of magnetic flux. In some embodiments, the gap G is around 15 mm, but the present disclosure is not limited thereto.

The apparatus 20 may further include a coil 24 wound around a portion, for example, at the end 23a and the end 23b, of iron core 23. The coil 24 may be made by copper or other suitable conductive materials. In order to induce magnetic flux, current is flowed through the coil 24 around the iron core 23 to generate magnetic field. Each end of the coil 24 is connected to cathode and anode of a power supply 27, and the magnetic flux established by the coil 24 enabling the electromagnetic element 21 to become a polarization means for polarizing magnetic semiconductor devices. In some embodiments, each of the end 23a and the end 23b of the iron core 23 is surrounded by a set of coils 24 to enhance the magnetic field at such positions. The coil 24 may or may not partially surround the electromagnetic element 21. In some of the embodiments, the first electromagnetic element 21a and the second electromagnetic element 21b is not surrounded by the coils 24. It is noteworthy that increasing the number of windings of the coil 24 may increase the magnitude of the generated magnetic field.

The apparatus 20 may optionally include a temperature detector 28 to detect a temperature of the electromagnetic element 21, the iron core 23, and/or the coils 24, so that a temperature of the electromagnetic element 21, the iron core 23, and/or the coils 24 can be controlled within a predetermined temperature limitation. For example, a temperature of the electromagnetic element 21, the iron core 23, and/or the coils 24 is under 70° C. during the operation of polarizing the semiconductor wafer 1 to avoid safety issue.

Figure 7:
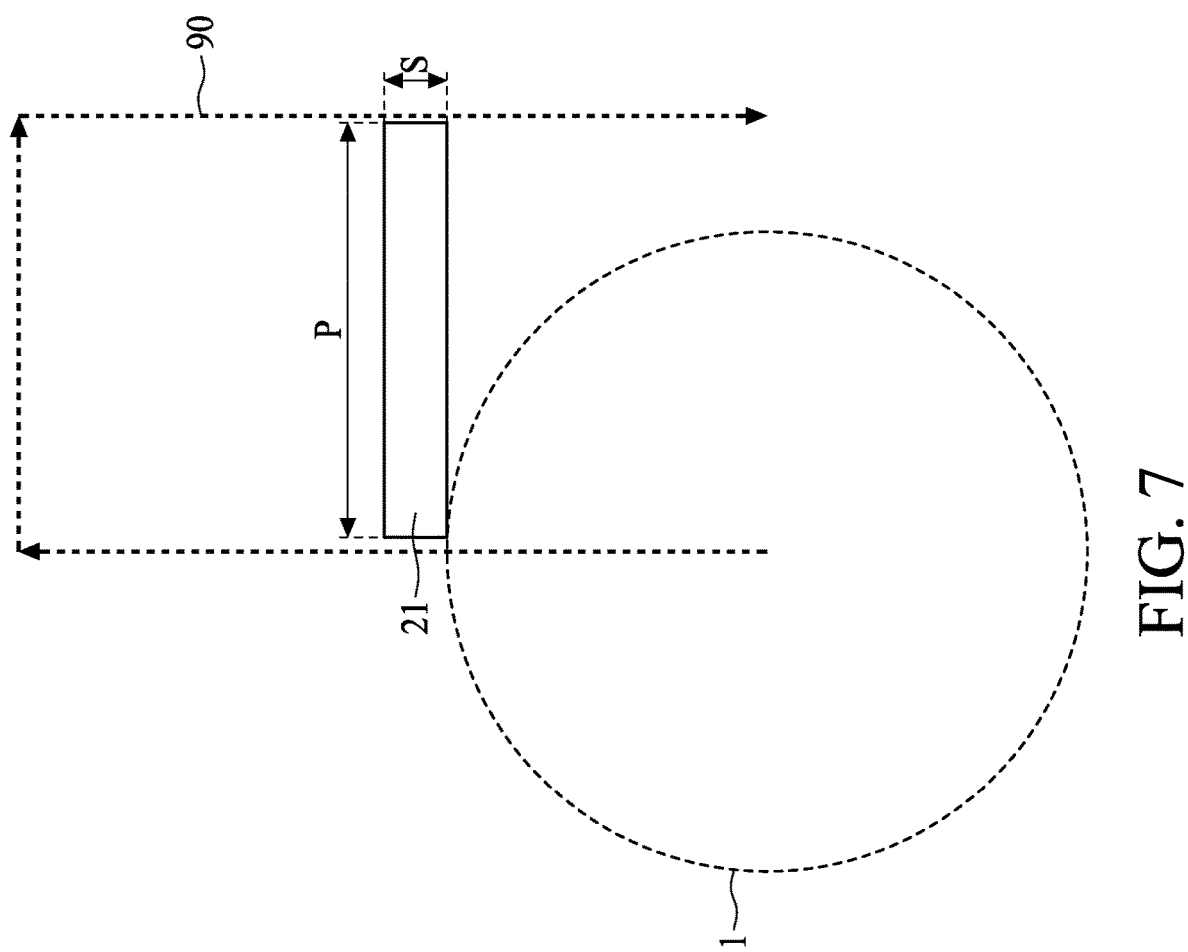
FIG. 7 is a schematic drawing illustrating a top perspective view of an electromagnet element and a predetermined path of a semiconductor wafer during an operation of polarizing a semiconductor wafer, in accordance with some embodiments of the present disclosure.
Figure 8A:
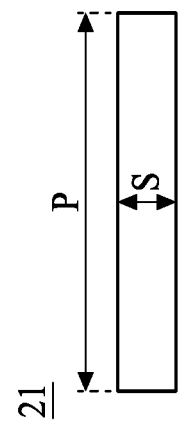
FIG. 8A to 8F are schematic drawings illustrating a top perspective view of electromagnet elements with various types of shapes, in accordance with some embodiments of the present disclosure.
Figure 8B:
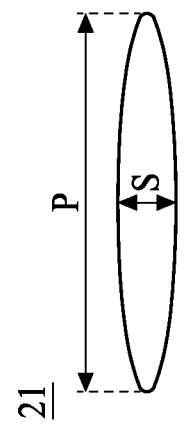
Figure 8C:
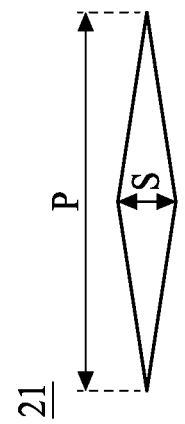
Figure 8D:
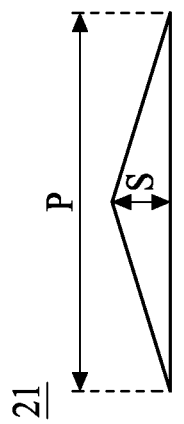
Figure 8E:
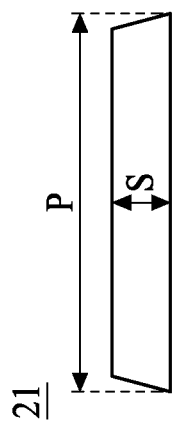
Figure 8F:
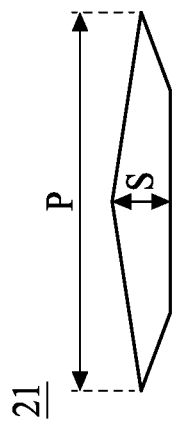

Referring to FIG. 5, FIG. 6 and FIG. 7, FIG. 7 is a schematic drawing illustrating a top perspective view of an electromagnet element and a predetermined path of a semiconductor wafer during an operation of polarizing a semiconductor wafer, in accordance with some embodiments of the present disclosure. In order to efficiently polarize a semiconductor wafer 1, the apparatus 20 further include a movable stage 26 connected to the supporter 25. The movable stage 26 is configured to displace the semiconductor wafer 1 disposed on the supporter 25 along a predetermined path 90, so the magnetic field between the gap G and an area adjacent to gap G can be applied to the semiconductor wafer 1. In some embodiments, in order to efficiently polarize the entire (or at least most of the) semiconductor wafer 1, the movable stage 26 displaces the semiconductor wafer 1 in a scanning manner through the generated magnetic field along the predetermined path 90, as the details will be subsequently discussed in FIG. 9 to FIG. 11A. The movable stage 26 may be coupled to a controller, and such controller may be implemented by software such that the methods disclosed herein can be performed automatically or semi-automatically. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions can be received from a remote storage device, such as a server on a network. The present invention can also be implemented in hardware systems, microcontroller unit (MCU) modules, discrete hardware or firmware.

Referring to FIG. 6, FIG. 7 and FIG. 8A to FIG. 8F, FIG. 8A to FIG. 8F are schematic drawings illustrating a top perspective view of electromagnet elements with various types of shapes, in accordance with some embodiments of the present disclosure. In some embodiments, in order to facilitate the scanning efficiency of polarizing the semiconductor wafer 1 and lowering the requirement of power supply while provide adequate magnitude of magnetic flux, the electromagnetic element 21 (which may include the first electromagnetic element 21*a* and the second electromagnetic element 21*b* in some embodiments) is configured to have a linear shape. In the present disclosure, the shape of the electromagnetic element 21 may be defined in various ways. In some embodiments, a shape of a bottom surface or a top surface of the electromagnetic element facing the gap G is deemed as the shape of the electromagnetic element 21. In some other embodiments, the electromagnetic element 21 has a constant shape along a vertical direction (which may be in Z direction, as shown in the example illustrated in FIG. 6). The shape of the electromagnetic element 21 in any of FIG. 8A to FIG. 8F is a cross-sectional shape along X-Y plane (the X-Y plane is shown in FIG. 5). In some other embodiments, a cross-sectional shape at the aforesaid position is deemed as the shape of the electromagnetic element 21. In some other embodiments, the first electromagnetic element 21*a* and the second electromagnetic element 21*b* have a constant shape along the vertical direction, and the first electromagnetic element 21*a* and the second electromagnetic element 21*b* have identical and aligned shape from a top view perspective. FIG. 8A to FIG. 8F further provide some embodiments of suitable shapes of an electromagnetic element 21 of the apparatus 20. For example, a shape of the electromagnetic element 21 (or the first electromagnetic element 21*a* and the second electromagnetic element 21*b*) may be quadratic (such as rectangular, rhombus shape, parallelogram shape, trapezoid shape), rounded (such as elliptical), triangular, polygonal, irregular shape, or other suitable shape. It should be noted that the present disclosure is not limited to the examples illustrated in FIG. 8A to FIG. 8F. Specifically, a shape of the electromagnetic element 21 (or the first electromagnetic element 21*a* and the second electromagnetic element 21*b*) may have a primary dimension P and a secondary dimension S from a top view perspective. The primary dimension P is greater than the secondary dimension S. In some embodiments, a direction along the primary dimension P is perpendicular to a direction along the secondary dimension S. In some embodiments, the secondary dimension S is greater than 1 mm, so that the coverage of generated magnetic field to the wafer manufactured with magnetic semiconductor devices is large enough and the efficiency of polarizing semiconductor wafer 1 is adequate.

Figure 9A:
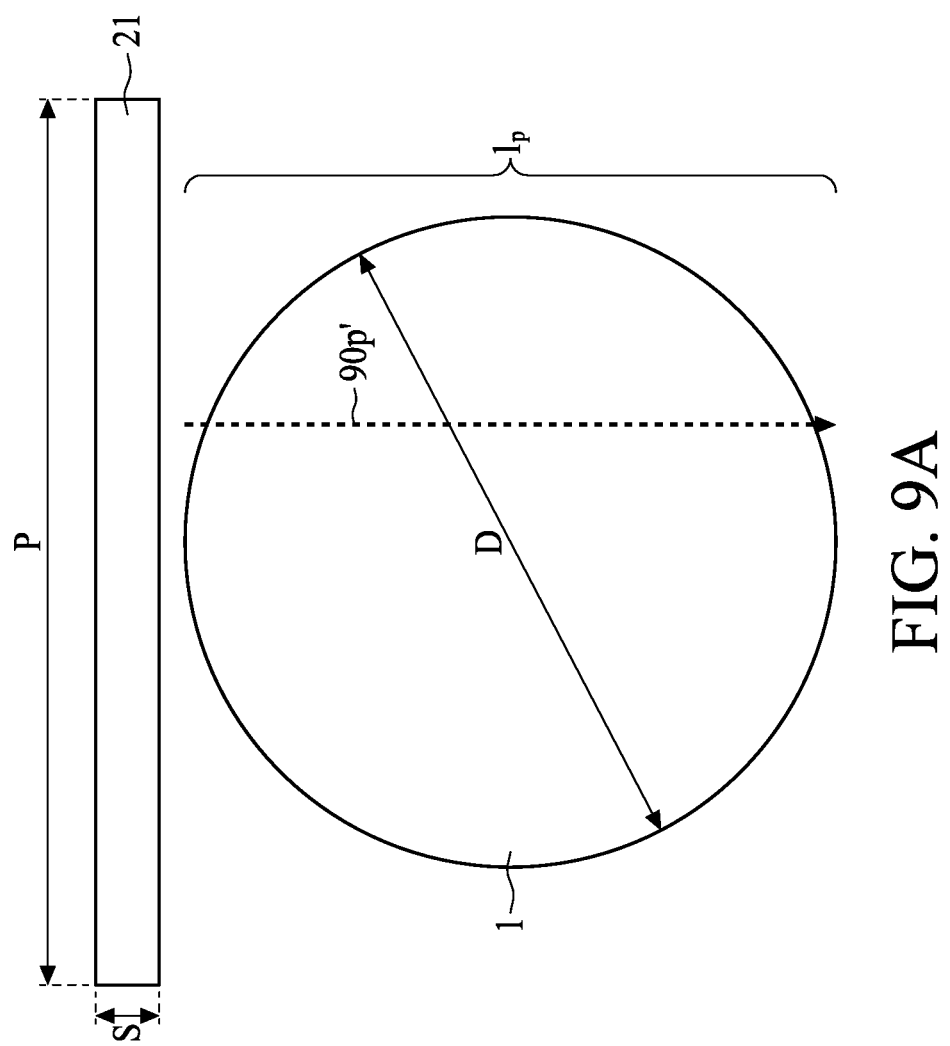
FIG. 9A is a schematic drawing illustrating a change of position of an electromagnet element relative to a position of a semiconductor wafer, in accordance with some embodiments of the present disclosure.

Referring to FIG. 5, FIG. 9 and FIG. 9A, FIG. 9 is a schematic drawing illustrating a top perspective view of an electromagnet element and a predetermined path of a predetermined path of a semiconductor wafer during an operation of polarizing a semiconductor wafer, and FIG. 9A is a schematic drawing illustrating a change of position of a electromagnet element relative to a position of a semiconductor wafer, in accordance with some embodiments of the present disclosure. In order to displace the semiconductor wafer 1 through the magnetic field generated in the gap G, the movable stage 26 displaces the supporter 25 supporting the semiconductor wafer 1 along a predetermined path through the magnetic field. In some embodiments, as shown in FIG. 9, in order to enhance the efficiency of the operation, the semiconductor wafer 1 is displaced along a first path 90*p* across the electromagnetic element 21 along the secondary dimension S, which may be parallel to a referential diameter of the semiconductor wafer 1. An edge of the semiconductor wafer 1 moves with respect to the electromagnetic element 21, and along the first path 90*p*, any specific location on the wafer 1 is firstly moved toward the electromagnetic element 21 and then away from the electromagnetic element 21. For the purpose of clear explanation, FIG. 9A illustrates changing of a position of the electromagnetic element 21 relative to the semiconductor wafer 1. Herein a distance $l_p$ of the first path 90*p* is greater than or equal to a diameter D of the semiconductor wafer 1, so that the efficiency of polarization can be improved. An entire area between an edge to the opposite edge of the semiconductor wafer 1 is polarized by the generated magnetic field by a displacement along one direction. Alternatively stated, during the displacement through first path 90*p*, the physical scanning coverage of electromagnetic element 21 at least covers the area from an edge to an opposite edge of the semiconductor wafer 1 along the first path 90*p*. In some embodiments, the entire semiconductor wafer 1 is applied to the magnetic field within the displacement along the first path 90*p*. However in some other embodiments, only a portion of the semiconductor wafer 1 is applied to the magnetic field within the displacement along the first path 90*p*.

As of the changing of the position of the electromagnetic element 21 relative to the semiconductor wafer 1 illustrated in FIG. 9A, it can be deemed as the electromagnetic element 21 move along a path 90*p*' across the semiconductor wafer 1, wherein a distance of the path 90*p*' is identical to the distance $l_p$ of the first path 90*p*.

Figure 10:
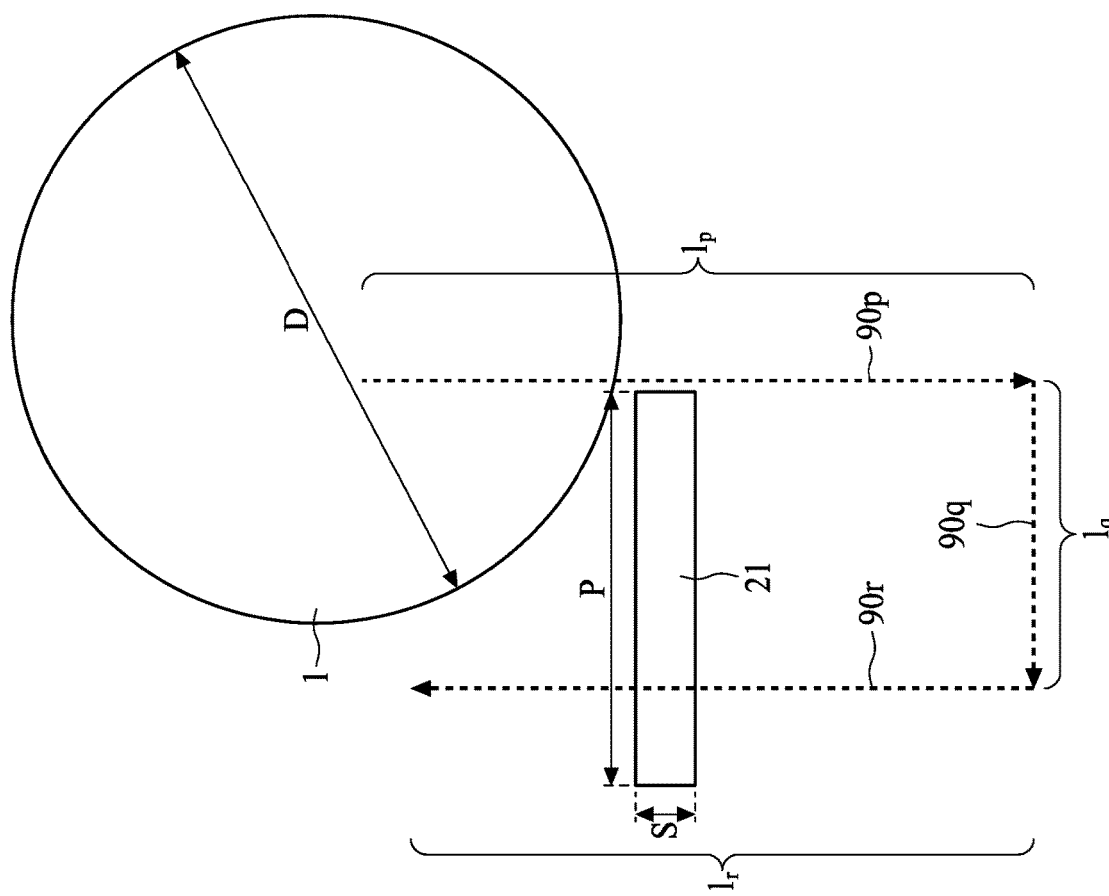
FIG. 10 is a schematic drawing illustrating a top perspective view of an electromagnet element and a predetermined path of a predetermined path of a semiconductor wafer during an operation of polarizing a semiconductor wafer, in accordance with some embodiments of the present disclosure.
Figure 10A:
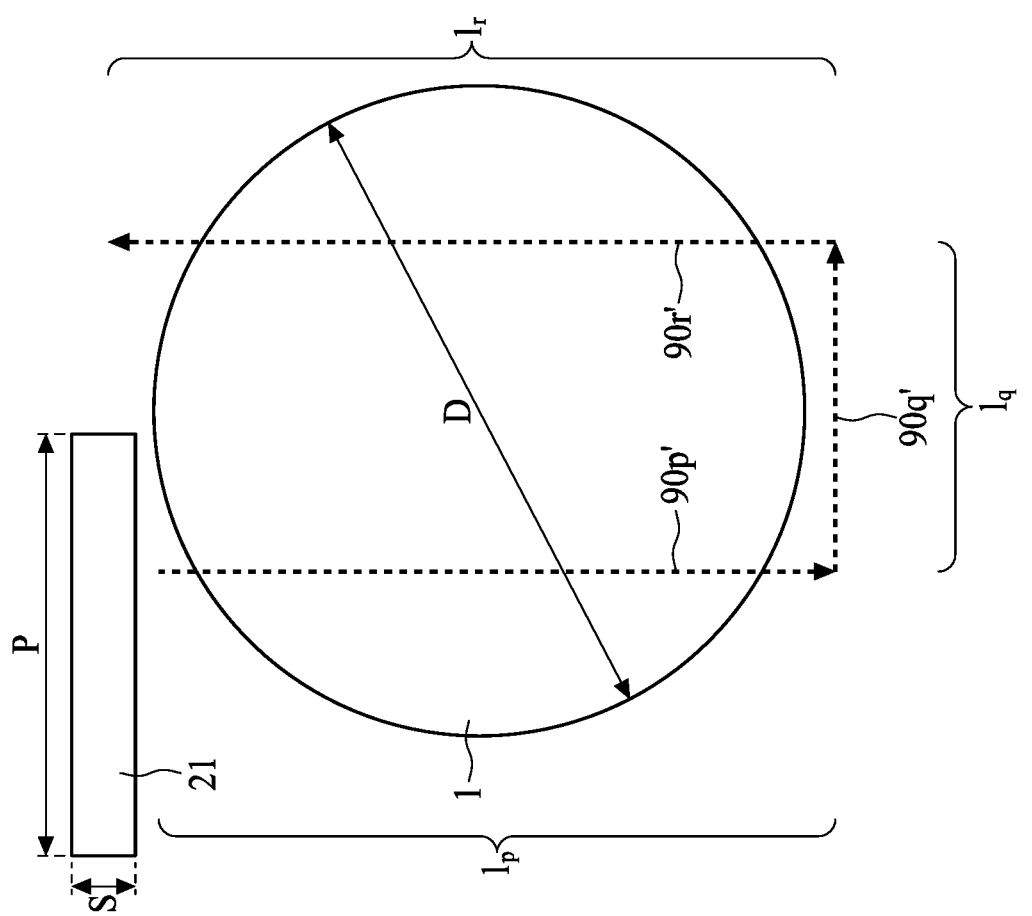
FIG. 10A is a schematic drawing illustrating a change of position of a electromagnet element relative to a position of a semiconductor wafer, in accordance with some embodiments of the present disclosure.

Referring to FIG. 10 and FIG. 10A, FIG. 10 is a schematic drawing illustrating a top perspective view of an electromagnet element and a predetermined path of a predetermined path of a semiconductor wafer during an operation of polarizing a semiconductor wafer, and FIG. 10A is a schematic drawing illustrating a change of position of a electromagnet element relative to a position of a semiconductor wafer, in accordance with some embodiments of the present disclosure. In the embodiments of only a portion of the semiconductor wafer 1 is being polarized by the magnetic field within the displacement along the first path 90*p*, the movable stage 26 may further displace the semiconductor wafer 1 along a second path 90*q* and a third path 90*r*, wherein the second path 90*q* is unparalleled to the first path 90*p* (for example, the direction of the second path 90*q* may be perpendicular to the first path 90*p*, which may be along the direction of the primary dimension P), and the third path 90*r* is substantially parallel to the first path 90*p* (which may be along the secondary dimension S) while the direction of the third path 90*r* is opposite to the first path 90*p*. In order to ensure that an area between the first path 90*p* and the third path 90*r* is applied to the magnetic field with adequate magnitude of magnetic flux (which will be subsequently discussed in FIG. 12A to FIG. 12C), a distance $l_q$ of the second path 90*q* is less than or equal to the primary dimension P of the electromagnetic element 21, so that a physical scanning coverage during the displacement through the first path 90*p* and the third path 90*r* are overlapped, or at least abut with each other. Furthermore, similar to previously discussed, a distance $l_r$ of the third path 90*r* is greater than or equal to the diameter D of the semiconductor wafer 1, so that the physical scanning coverage of electromagnetic element 21 at least covers the area from an edge to an opposite edge during the displacement along the third path 90*r*.

As of the changing of the position of the electromagnetic element 21 relative to the semiconductor wafer 1 illustrated in FIG. 10A, it can be deemed as the electromagnetic element 21 move along a path 90*p*' across the semiconductor wafer 1 (which may be along the secondary dimension S), a path 90q' unparalleled to the path 90p' (which may be perpendicular to the path 90p' or may be along the primary dimension P), and a path 90r' across the semiconductor wafer 1, which is parallel and opposite to the path 90p'. A distance of the path 90p', the path 90q', and the path 90r' are respectively identical to the counterpart the first path 90p, the second path 90q, and the third path 90r as shown in FIG. 10.

Figure 11:
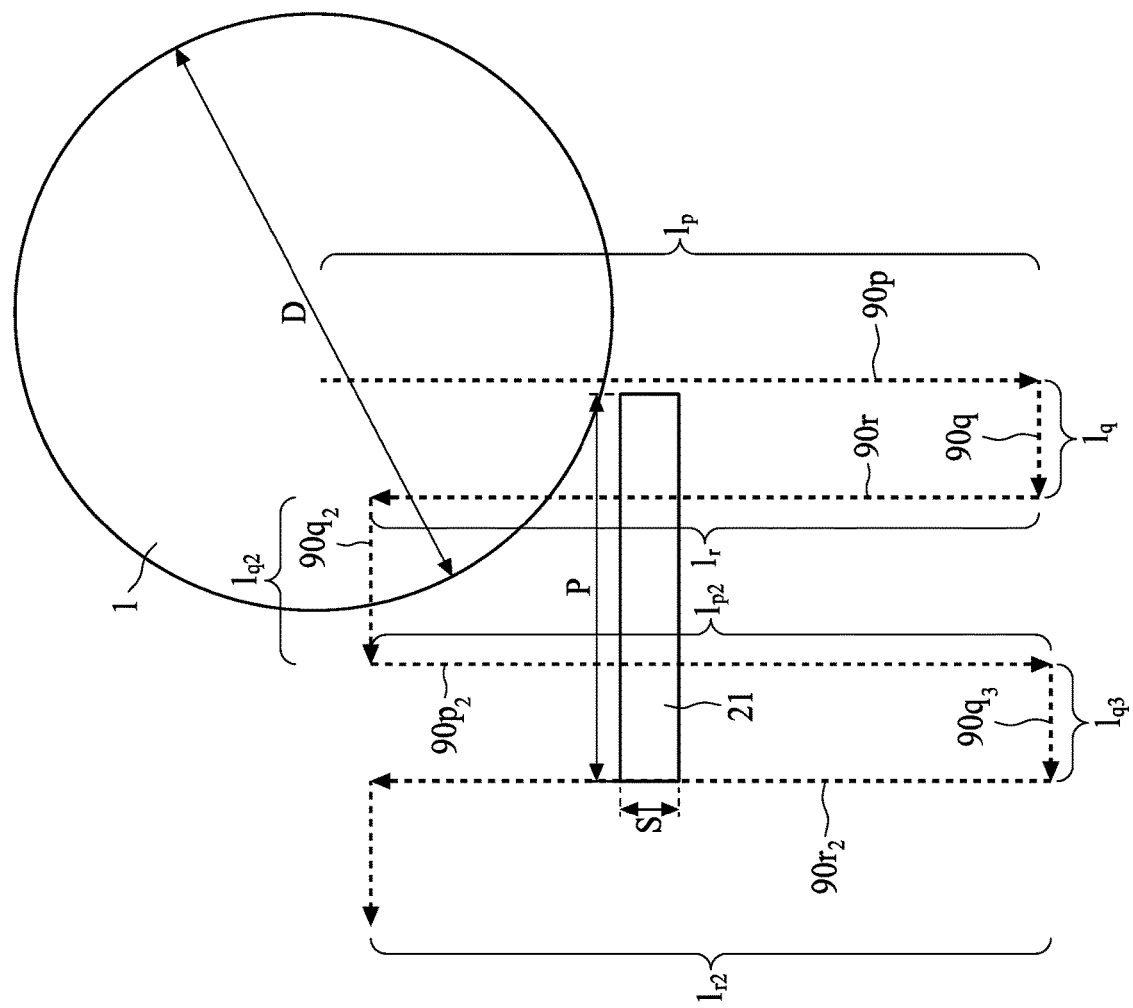
FIG. 11 is a schematic drawing illustrating a top perspective view of an electromagnet element and a predetermined path of a semiconductor wafer during an operation of polarizing a semiconductor wafer, in accordance with some embodiments of the present disclosure.
Figure 11A:
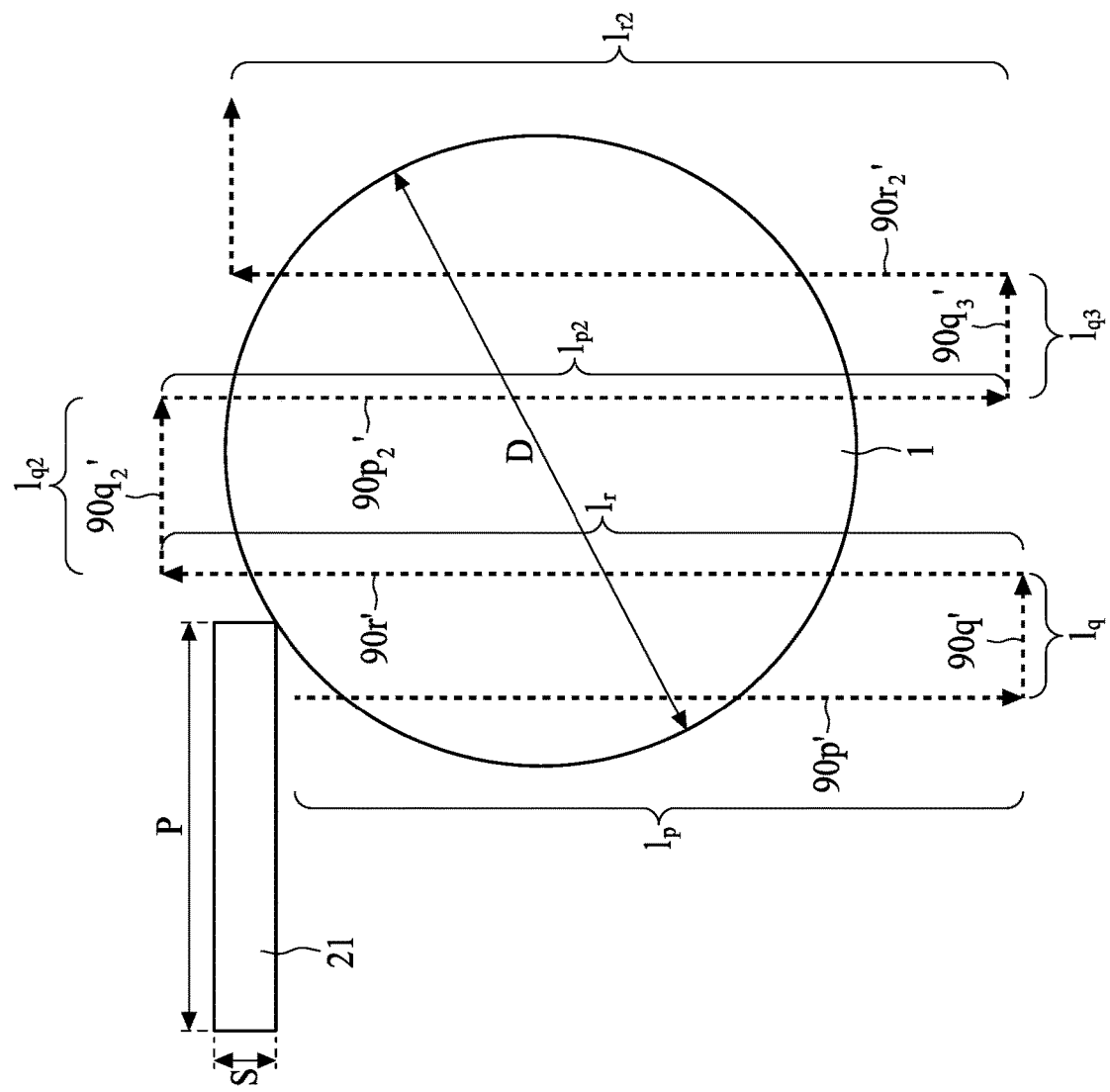
FIG. 11A is a schematic drawing illustrating a change of position of an electromagnet element relative to a position of a semiconductor wafer, in accordance with some embodiments of the present disclosure.

Referring to FIG. 11 and FIG. 11A, FIG. 11 is a schematic drawing illustrating a top perspective view of an electromagnet element and a predetermined path of a predetermined path of a semiconductor wafer during an operation of polarizing a semiconductor wafer, and FIG. 11A is a schematic drawing illustrating a change of position of a electromagnet element relative to a position of a semiconductor wafer, in accordance with some embodiments of the present disclosure. In some of the embodiments, after the semiconductor wafer 1 is displaced along the first path 90p, the second path 90q, and the third path 90r, a portion of the semiconductor wafer 1 is still not polarized the magnetic field. Thus the movable stage 26 further displaces the semiconductor wafer 1 through a predetermined path so that the remaining not polarized area can be polarized by the magnetic field. In some embodiments, the path includes one or more trajectories, which is similar to a raster scanning path. For example, subsequent to moving the semiconductor wafer 1 along the third path 90r, the semiconductor wafer 1 may be displaced through a fourth path $90q_2$ along the primary dimension P (which may have a same direction as the second path 90q), a fifth path $90p_2$ along the secondary dimension S (which may have a same direction as the first path 90p), a sixth path $90q_3$ along the primary dimension P (which may have a same direction as the second path 90q), and/or a seventh path $90r_2$ along the primary dimension P (which may have a same direction as the third path 90r), or further include subsequent paths, until a predetermined area of the semiconductor wafer 1 are polarized by magnetic field. In some embodiments, the first path 90p, the second path 90q, the third path 90r, the fourth path $90q_2$, the fifth path $90p_2$, the sixth path $90q_3$, the seventh path $90r_2$, or subsequent paths are linear so that the efficiency of polarizing the semiconductor wafer 1 is improved. Furthermore, a distance $l_{p2}$ of fifth path $90p_2$ and/or a distance $l_{r2}$ of seventh path $90r_2$ is greater than or equal to a diameter D of the semiconductor wafer 1, while a distance $l_{q2}$ of the fourth path $90q_2$ and/or a distance $l_{q3}$ of the sixth path $90q_3$ is less than or equal to the primary dimension P of the electromagnetic element 21, so that a physical scanning coverage during the displacement through the third path 90r, the fifth path $90p_2$, and/or the seventh path $90r_2$ are overlapped, or at least abut with each other.

As of the changing of the position of the electromagnetic element 21 relative to the semiconductor wafer 1 illustrated in FIG. 11A, it can be deemed as the electromagnetic element 21 move along a path 90p' across the semiconductor wafer 1 (which may be along the secondary dimension S), a path 90q' unparalleled to the path 90p' (which may be along the primary dimension P), a path 90r' across the semiconductor wafer 1 (which is parallel and opposite to the path 90p'), a path $90q_2$' unparalleled to the path 90p' (which may be along the primary dimension P), a path $90p_2$' across the semiconductor wafer 1 (which may be along the secondary dimension S), a path $90q_3$' unparalleled to the path $90p_2$' (which may be along the primary dimension P), a path $90r_2$' across the semiconductor wafer 1 (which is parallel and opposite to the path $90p_2$').

Figure 12A:
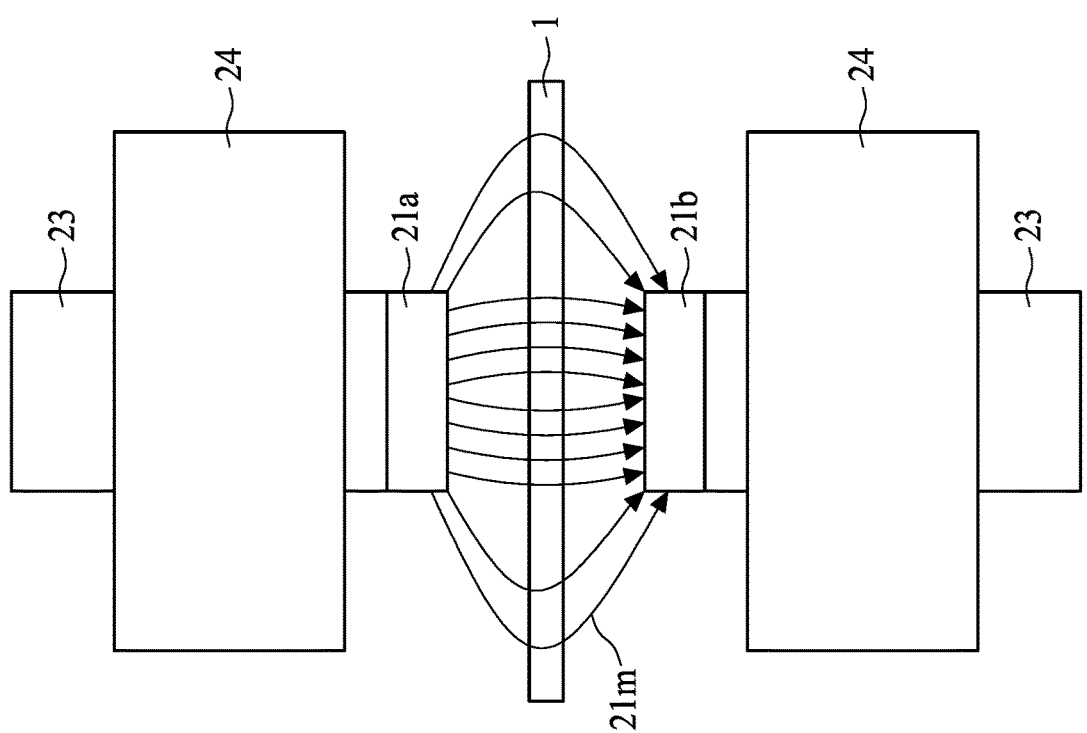
FIG. 12A is a schematic drawing illustrating some magnetic lines between a first electromagnetic element and a second electromagnetic element, in accordance with some embodiments of the present disclosure.
Figure 12C:
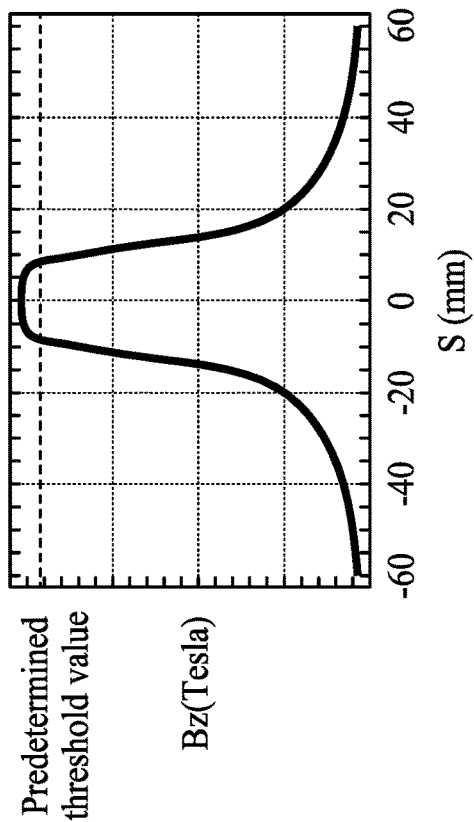
FIG. 12B and FIG. 12C are schematic diagrams relatively showing a magnetic coverage of an electromagnet element along a primary direction and a secondary direction, in accordance with some embodiments of the present disclosure.
Figure 12B:
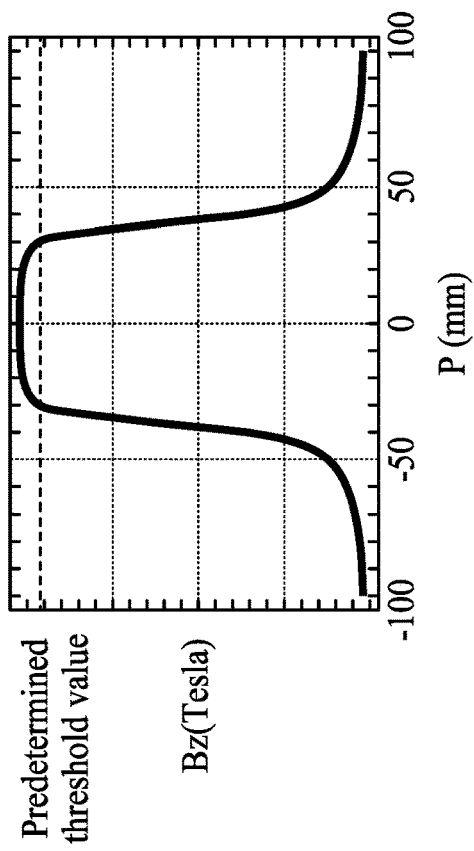

Referring to FIG. 12A, FIG. 12B, and FIG. 12C, FIG. 12A is a schematic drawing illustrating several magnetic lines between a first electromagnetic element and a second electromagnetic element, FIG. 12B and FIG. 12C are schematic diagrams relatively showing a magnetic coverage of a electromagnet element along a primary direction and a secondary direction, in accordance with some embodiments of the present disclosure. Due to the fringing effect induced around the gap G and/or the curl of magnetic flux 21m of the magnetic field, a magnetic coverage of the generated magnetic field on the semiconductor wafer 1 is greater than the cross-sectional area along x-y plane of the electromagnetic element 21, as shown in FIG. 5. In order to effectively polarize a semiconductor wafer 1 with desired reliability, in some embodiments, a magnitude of the magnetic field generated by the electromagnetic element 21 has to be greater than a predetermined threshold value, for example, 1.8 Tesla. Thus a magnetic coverage of the magnetic field generated by the electromagnetic element 21 may be defined as a coverage area passed by a magnetic flux of the magnetic field with a magnitude greater than the predetermined threshold value. For example, in order to polarize a given semiconductor wafer 1 with adequate reliability, the magnitude of the magnetic field passing through the semiconductor wafer 1 may be at least greater than 1.8 Tesla. In some embodiments, a primary dimension P of each of the first electromagnetic element 21a and the second electromagnetic element 21b is about 40 mm, and a secondary dimension S of each of the first electromagnetic element 21a and the second electromagnetic element 21b is about 4 mm, and a gap between the first electromagnetic element 21a and the second electromagnetic element 21b is about 5 mm. In this example, a magnetic coverage of the magnetic field generated by the first electromagnetic element 21a and the second electromagnetic element 21b has a width of about 65 mm along the primary dimension P and a width of about 20 mm along the secondary dimension S. That is, the magnetic coverage of the electromagnetic element on the semiconductor wafer 1 is greater than a physical cross sectional area of the first electromagnetic element 21a or the second electromagnetic element 21b.

Due to the aforesaid phenomena, the magnetic coverage of the electromagnetic element during displacing the semiconductor wafer 1 along the first path 90p (as shown in FIG. 11) may overlap with the magnetic coverage of the electromagnetic element during displacing the semiconductor wafer 1 along the third path 90r, and the magnetic coverage during displacing along the fifth path $90p_2$ may overlap with the magnetic coverage of the magnetic field during displacing the semiconductor wafer 1 along the third path 90r. Alternatively stated, the magnetic coverage on the semiconductor wafer 1 during a path along the secondary dimension S overlaps with the magnetic coverage on the semiconductor wafer 1 during a subsequent/previous path along the secondary dimension S. By this configuration, some of the area can be treated by the magnetic field with a magnitude greater than the predetermined threshold value by more than one time, thus not only the polarization efficiency but also the yield of switching the magnetic semiconductor device on the semiconductor wafer 1 from parallel state to anti-parallel state (or vice versa) can be improved.

Figure 13:
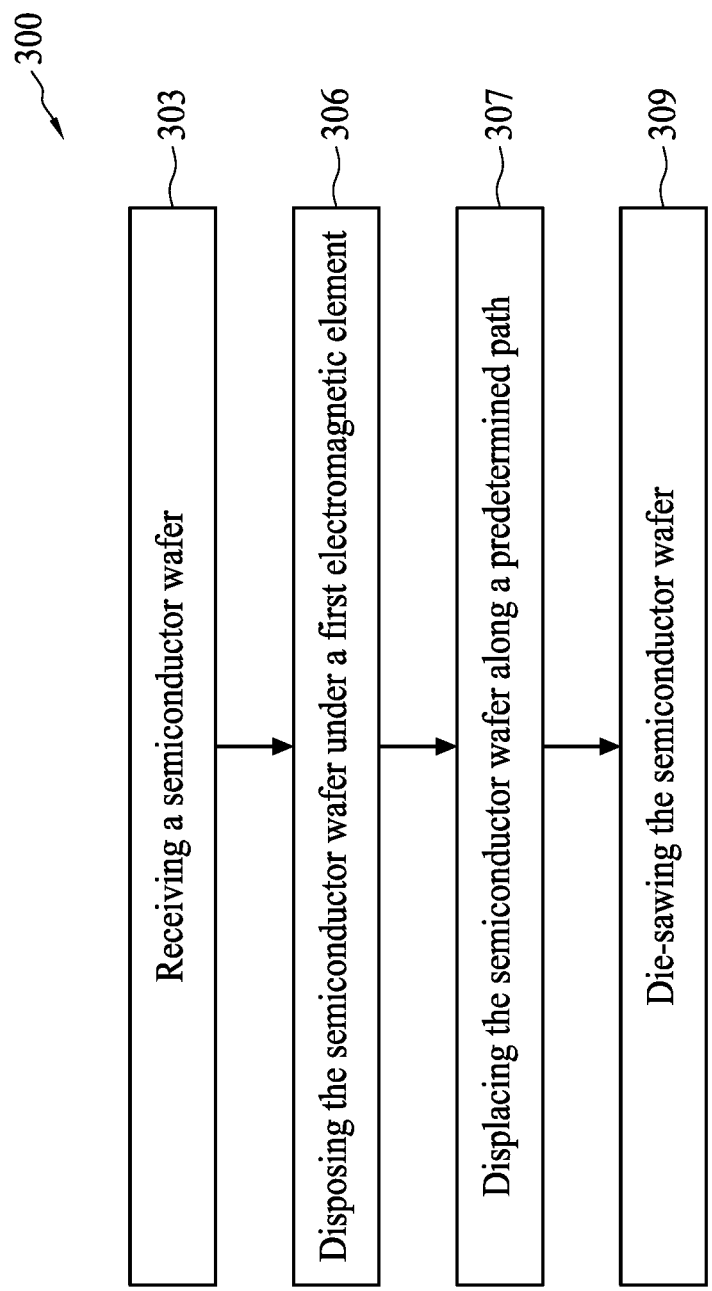
FIG. 13 shows a flow chart representing method for fabricating a magnetic semiconductor device, in accordance with some embodiments of the present disclosure.

Referring to FIG. 13, FIG. 13 shows a flow chart representing method for fabricating a magnetic semiconductor device, in accordance with some embodiments of the present disclosure. The method 300 for fabricating a magnetic semiconductor device includes receiving a semiconductor wafer (operation 303), disposing the semiconductor wafer under a first electromagnetic element (operation 306), displacing the semiconductor wafer along a predetermined path (operation 307), and die-sawing the semiconductor wafer (operation 309).

Figure 14:
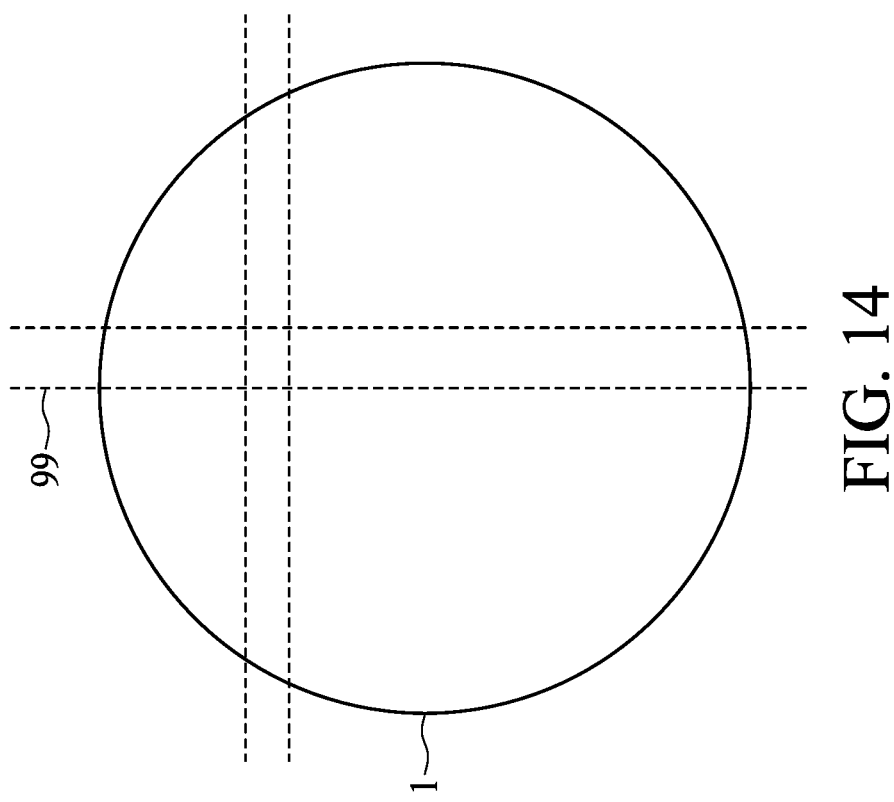
FIG. 14 is a schematic drawing illustrating an operation of die-sawing a semiconductor wafer, in accordance with some embodiments of the present disclosure.

Referring to FIG. 14, FIG. 14 is a schematic drawing illustrating an operation of die-sawing a semiconductor wafer, in accordance with some embodiments of the present disclosure. After the magnetic semiconductor devices on the semiconductor wafer 1 are polarized, the semiconductor wafer 1 is singulated into individual semiconductor dies. In some embodiments, a die-sawing operation is performed on the semiconductor wafer 1 by sawing through predetermined scribe line 99. Since the operation of switching the magnetic semiconductor device on the semiconductor wafer 1 from parallel state to anti-parallel state (or vice versa) is performed beforehand, the semiconductor wafer 1 can be singulated by die-sawing and then packaged, thus facilitate the yield and the efficiency of polarization since it may take less time to polarize the semiconductor wafer 1 comparing to polarize the singulated, individual device packages.

The methods provided in the present disclosure can be applied to various types of magnetic semiconductor devices, such as MRAM or other types of memory devices, or the like. Some of the methods provided in the present disclosure can be applied to technology nodes under N40, such as N40, N28, N20, N16, et cetera.

The present disclosure provides an apparatus for polarizing a semiconductor wafer, a method for fabricating a magnetic semiconductor device, and a method for fabricating a magnetic semiconductor device. The electromagnetic element 21 of the apparatus 20 has a linear shape, that is, having a primary dimension P greater than a secondary dimension S. The configuration of the electromagnetic element 21 can generate adequate magnitude of magnetic field while lower power consumption. Furthermore, by displacing the semiconductor wafer 1 along a predetermined linear path through the magnetic field generated by the electromagnetic element 21, the efficiency of polarizing the semiconductor wafer 1 is improved. Specifically, the displacement path may include a first path along the secondary dimension across the electromagnetic element 21, and optionally a second path perpendicular to the first path and a third path parallel and opposite to the first path. Such combination of the displacement path of the semiconductor wafer 1 and the shape of the electromagnetic element 21 reduces the interval of scanning through the semiconductor wafer 1 and thus improve efficiency of fabrication. In some embodiments, distances between the paths along the secondary dimension may be less than or equal to the primary dimension of the electromagnetic element 21, so that the physical coverage of the electromagnetic element 21 and/or a magnetic coverage of the electromagnetic element 21 can be overlapped during such paths, so some area of the semiconductor wafer 1 can be treated by the magnetic field more than one time, thence the reliability of polarization can be enhanced.

Some embodiments of the present disclosure provide a method for fabricating a magnetic semiconductor device, including receiving a semiconductor wafer, disposing the semiconductor wafer under a first electromagnetic element, wherein the first electromagnetic element comprises a primary dimension and a secondary dimension from a top view perspective, the primary dimension being greater than the secondary dimension, and displacing the semiconductor wafer along a predetermined path along the secondary dimension of the first electromagnetic element.

Some embodiments of the present disclosure provide a method for polarizing a magnetic semiconductor device, including receiving a semiconductor wafer having the magnetic semiconductor device, disposing the semiconductor wafer under an electromagnetic element, the electromagnetic element having a primary dimension and a secondary dimension shorter than the primary dimension, displacing the semiconductor wafer along a first direction parallel to a diameter of the semiconductor wafer, and die-sawing the semiconductor wafer.

Some embodiments of the present disclosure provide an apparatus for polarizing a semiconductor wafer, including a supporter configured to support the semiconductor wafer, an electromagnetic element overlapping with the supporter, the electromagnetic element comprising a primary dimension and a secondary dimension from a top view perspective, the primary dimension being greater than the secondary dimension, and a power supply connected to the electromagnetic element.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method for fabricating a magnetic semiconductor device, comprising:
   receiving a semiconductor wafer comprising a plurality of magnetic device, the plurality of magnetic device have a first resistance state; and
   changing a resistance state of the plurality of magnetic device from the first resistance state to a second resistance state different from the first resistance state, comprising:
      disposing the semiconductor wafer under a first electromagnetic element, wherein the first electromagnetic element comprises a primary dimension and a secondary dimension from a top view perspective, the primary dimension being greater than the secondary dimension; and
      displacing the semiconductor wafer along a predetermined path along the secondary dimension of the first electromagnetic element.

2. The method of claim 1, further comprising performing a die-sawing operation to the semiconductor wafer after displacing the semiconductor wafer.

3. The method of claim 1, further comprising disposing the semiconductor wafer above a second electromagnet element.

4. The method of claim 3, wherein the first electromagnetic element aligns with the second electromagnet element.

5. The method of claim 1, further comprising displacing the semiconductor wafer along the primary dimension subsequent to displacing the semiconductor wafer along the secondary dimension.

6. The method of claim 5, wherein the semiconductor wafer is displaced along the primary dimension by a distance smaller than or equal to the primary dimension.

7. A method for fabricating a magnetic semiconductor device, comprising:
receiving a semiconductor wafer comprising a plurality of magnetic semiconductor device having a first resistance state;
changing a resistance state of the plurality of magnetic device from the first resistance state to a second resistance state different from the first resistance state, comprising:
disposing the semiconductor wafer under an electromagnetic element, the electromagnetic element having a primary dimension and a secondary dimension shorter than the primary dimension; and
displacing the semiconductor wafer along a first direction parallel to a diameter of the semiconductor wafer; and
die-sawing the semiconductor wafer.

8. The method of claim 7, further comprising displacing the semiconductor wafer along the first direction by a first distance, the first distance being equal to or greater than the diameter of the semiconductor wafer.

9. The method of claim 8, further comprising displacing the semiconductor wafer along a second direction perpendicular to the first direction.

10. The method of claim 9, further comprising displacing the semiconductor wafer along the second direction by a second distance, the second distance being smaller than or equal to the primary dimension of the electromagnetic element.

11. The method of claim 9, further comprising displacing the semiconductor wafer along a third direction subsequent to displacing the semiconductor wafer along the second direction, wherein the third direction is opposite to the first direction.

12. The method of claim 7, wherein die-sawing the semiconductor wafer is performed subsequent to changing the resistance state of the plurality of magnetic device.

13. The method of claim 7, wherein displacing the semiconductor wafer along the first direction comprises transferring the semiconductor wafer so that an edge of the semiconductor wafer moves with respect to the electromagnetic element.

14. A method for fabricating a magnetic semiconductor device, comprising:
forming a magnetic device on a wafer; and
changing a resistance state of the magnetic device from a first state to a second state different from the first state, comprising:
placing the wafer on a movable stage; and
displacing the wafer from a first position to a second position different from the first position along a first direction, wherein a third position between the first position and the second position is directly under a first electromagnetic element, and the first electromagnetic element has a primary dimension greater than a secondary dimension.

15. The method of claim 14, wherein a distance between the first position and the second position is greater than a diameter of the wafer.

16. The method of claim 14, further comprising die-sawing the wafer after displacing the wafer from the first position to the second position.

17. The method of claim 14, displacing the wafer from the first position to the second position further comprises: displacing the wafer above a second electromagnetic element under the third position.

18. The method of claim 14, wherein when the wafer is at the first position or the second position, the wafer is free from being under a coverage of a vertical projection of the first electromagnetic element.

19. The method of claim 14, further comprising detecting a temperature of the first electromagnetic element, and cooling down the first electromagnetic element when the temperature is greater than a threshold temperature.

20. The method of claim 14, further comprising displacing the wafer along a second direction opposite to the first direction.

* * * * *